(12) United States Patent
Chang et al.

(10) Patent No.: US 10,103,019 B1
(45) Date of Patent: Oct. 16, 2018

(54) MANUFACTURING METHOD FOR FORMING A SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/725,258

(22) Filed: Oct. 4, 2017

(30) Foreign Application Priority Data

Sep. 8, 2017 (CN) .......................... 2017 1 0804122

(51) Int. Cl.
| | |
|---|---|
| *H01L 21/20* | (2006.01) |
| *H01L 21/02* | (2006.01) |
| *G02B 1/11* | (2015.01) |
| *H01L 51/00* | (2006.01) |

(52) U.S. Cl.
CPC .......... *H01L 21/02019* (2013.01); *G02B 1/11* (2013.01); *H01L 21/02318* (2013.01); *H01L 51/0001* (2013.01)

(58) Field of Classification Search
CPC ......... H01L 21/02019; H01L 21/02318; H01L 51/0001; G02B 1/11
See application file for complete search history.

(56) References Cited

U.S. PATENT DOCUMENTS

| | | | |
|---|---|---|---|
| 8,999,848 B2 | 4/2015 | Lee | |
| 2011/0165757 A1* | 7/2011 | Kim .................. | H01L 21/76229 438/427 |

\* cited by examiner

*Primary Examiner* — Nadine G Norton
*Assistant Examiner* — Mahmoud Dahimene
(74) *Attorney, Agent, or Firm* — Winston Hsu

(57) ABSTRACT

The present invention provides a method of fabricating a semiconductor structure. Firstly, a substrate is provided, a dense region and an isolation region are defined, next, a first dielectric layer is formed on the dense region and the isolation region, and then a plurality of first recesses are formed in the first dielectric layer within the dense region, and a second recess is formed in the first dielectric layer within the isolation region, wherein the width of the second recess is greater than three times of the width of each first recess. Afterwards, a second dielectric layer is then filled in each first recess and the second recess, wherein a top surface of the second dielectric layer within the isolation region is higher than a top surface of the second dielectric layer within the dense region. Next, an etching back process is performed, to remove the second dielectric layer.

16 Claims, 8 Drawing Sheets

US 10,103,019 B1

MANUFACTURING METHOD FOR FORMING A SEMICONDUCTOR STRUCTURE

BACKGROUND OF THE INVENTION

1. Field of the Invention

The present invention relates to field of semiconductor processes, particularly, to a semiconductor process includes a self-alignment step, and which can reduce the number of times for using the photomask.

2. Description of the Prior Art

With the trend in the industry being towards scaling down the size of the metal oxide semiconductor transistors (MOS), three-dimensional or non-planar transistor technology, such as fin field effect transistor technology (Fin FET), has been developed to replace planar MOS transistors. In current techniques, in order to achieve sub-lithographic features, a regular photolithography and an etching process accompanied with a pullback process are performed to form fin structures in Fin FETs.

However, as the size of the FETs shrink, the electrical and physical requirements in each part of the multi-gate FET become critical, like the sizes and shapes of the fin-shaped structures and the spacing between each fin-shaped structure for example. Thus, how to reach standard requirements and overcome the physical limitations has become an important issue in the industry of the FETs.

In the conventional art, if there are different regions (such as the isolation region and dense regions) defined on the substrate, the density of the elements in each region is not uniform, and the etching processes in different regions need to be carried out separately with different photomasks. In this way, it needs to spend more effort.

SUMMARY OF THE INVENTION

The present invention provides a method for forming a semiconductor structure, the method includes: firstly, a substrate is provided, a dense region and an isolation region are defined on the substrate, a first dielectric layer is then formed within the dense region and the isolation region, next, a plurality of first recesses are formed in the first dielectric layer within the dense region, and a second recess is formed in the first dielectric layer within the isolation region, wherein a width of the second recess is greater than three times of the width of each first recess, afterwards, a second dielectric layer is formed to fill up the first recesses and the second recess, wherein a top surface of the second dielectric layer within the isolation region is higher than a top surface of the second dielectric layer within the dense region, and an etching back process is performed to remove the second dielectric layer within the dense region and within the isolation region.

The invention is characterized in that the patterns are respectively formed in the dense region and the isolation region by using a same photomask, and using the difference of the element density between the dense region and the isolation region, to make the second dielectric layer within the dense region and within the isolation region have different top surface heights. Therefore, in the following etching processes, a portion of the second dielectric layer remains within the isolation region after the second dielectric layer within the dense region is completely removed. The pattern can be reserved within the isolation region when the self-aligned etching process is performed within the dense region. With the method provided by the invention, the number of times for using the photomask can be reduced, and the process efficiency can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
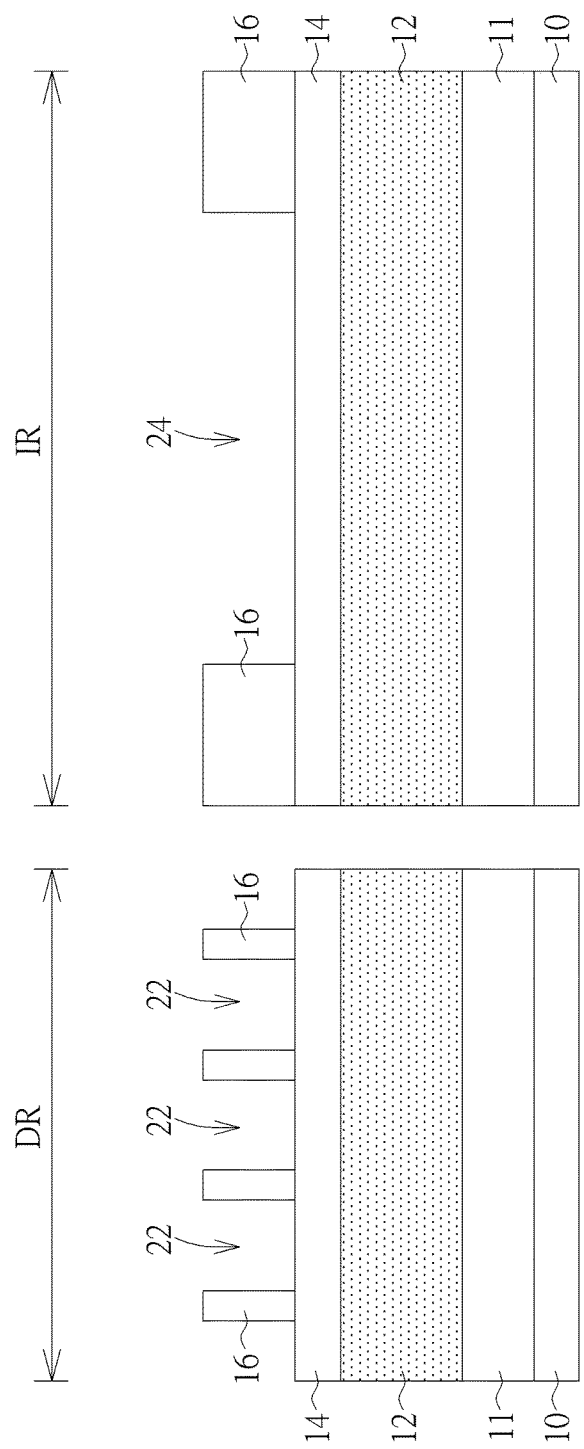
FIG. 1 to FIG. 8 are schematic views showing a method for manufacturing a semiconductor structure according to a first preferred embodiment of the present invention.

Please refer to FIG. 1 to FIG. 8. FIG. 1 to FIG. 8 are schematic views showing a method for manufacturing a semiconductor structure according to a first preferred embodiment of the present invention. As shown in FIG. 1, a substrate 10, such as a bulk silicon substrate is provided, next, a mask layer 11 is formed on the substrate 10, wherein the mask layer 11 may be a single layer structure or a multilayer structure. The formation method for forming the mask layer 11 includes such as the deposition process. In the present embodiment, the mask layer 11 includes such as a silicon nitride layer, but is not limited thereto. On the mask layer 11, a first dielectric layer 12, a material layer 14, and a photoresist layer 16 are sequentially formed. The first dielectric layer 12 includes such as an organic dielectric layer (ODL), and the material layer 14 includes such as a dielectric anti-reflective coating (DARC), but is not limited thereto. The first dielectric layer 12, the material layer 14, and the photoresist layer 16 may be formed by deposition processes or coating processes.

In addition, two different regions: a dense region DR and an isolation region IR are defined on the substrate 10 respectively. In the subsequent process, the element densities in the dense region DR and in the isolation region IR are different. For example, the dense region DR may be a core region of a semiconductor device, a plurality of transistors may be formed in the dense region DR. On the other hand, the isolation region IR may be a peripheral region of a semiconductor device or an input/output (I/O) region, the elements such as a resistor or gate structure may be formed within the isolation region IR. Usually, the elements that are formed within the dense region DR have smaller size than the elements formed within the isolation region IR, besides, the elements that are formed within the dense region DR are arranged more closely than the elements formed within the isolation region IR.

In FIG. 1, an exposure and developing step is performed to the photoresist layer 16, so as to form a plurality of recesses 22 within the dense region DR, and form at least one recess 24 within the isolation region IR. In the present embodiment, the position of each recess 22 within the dense region DR will correspond to the position of the predetermined element formed in the following steps (such as the gate structure) through a self-aligned process. And the position of the recess 24 is directly corresponding to the position of the element formed in the following steps (such as the resistor).

Figure 2:
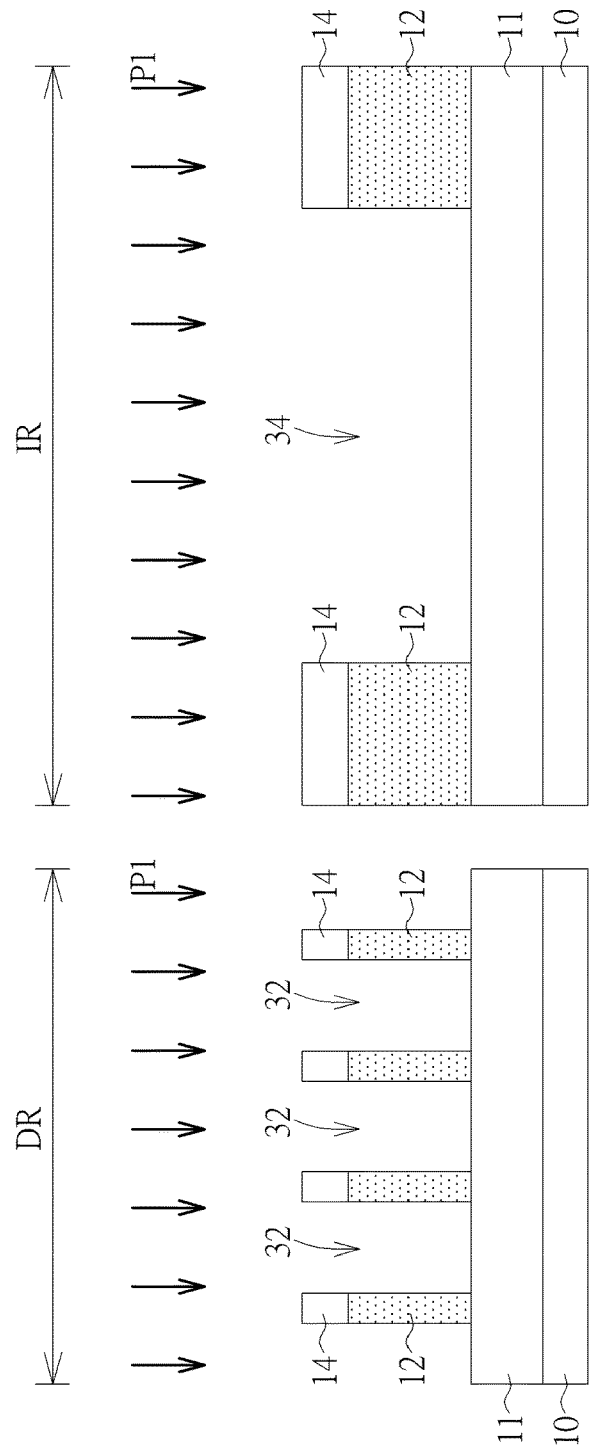

As shown in FIG. 2, a first etching process P1 is performed, using the photoresist layer 16 as a mask, to remove parts of the material layer 14 and parts of the first dielectric layer 12, and to transfer the pattern of the photoresist layer 16 into the material layer 14 and the first dielectric layer 12 disposed below. During or after the first etching process P1 is performed, the photoresist layer 16 can be removed entirely, but the present invention is not limited thereto. The photoresist layer 16 may be partially maintained on the material layer 14. In addition, after the first etching process P1 is carried out, a plurality of first recesses 32 are formed in the first dielectric layer 12 within the dense region DR again, and at least one second recess 34 is formed in the first dielectric layer 12 within the isolation region IR. The mask layer 11 is exposed by the first recesses 32 and the second recess 34. In the present embodiment, the width of the second recess 34 is greater than three times of the width of each first recess 32, preferably more than five times or more.

Figure 3:
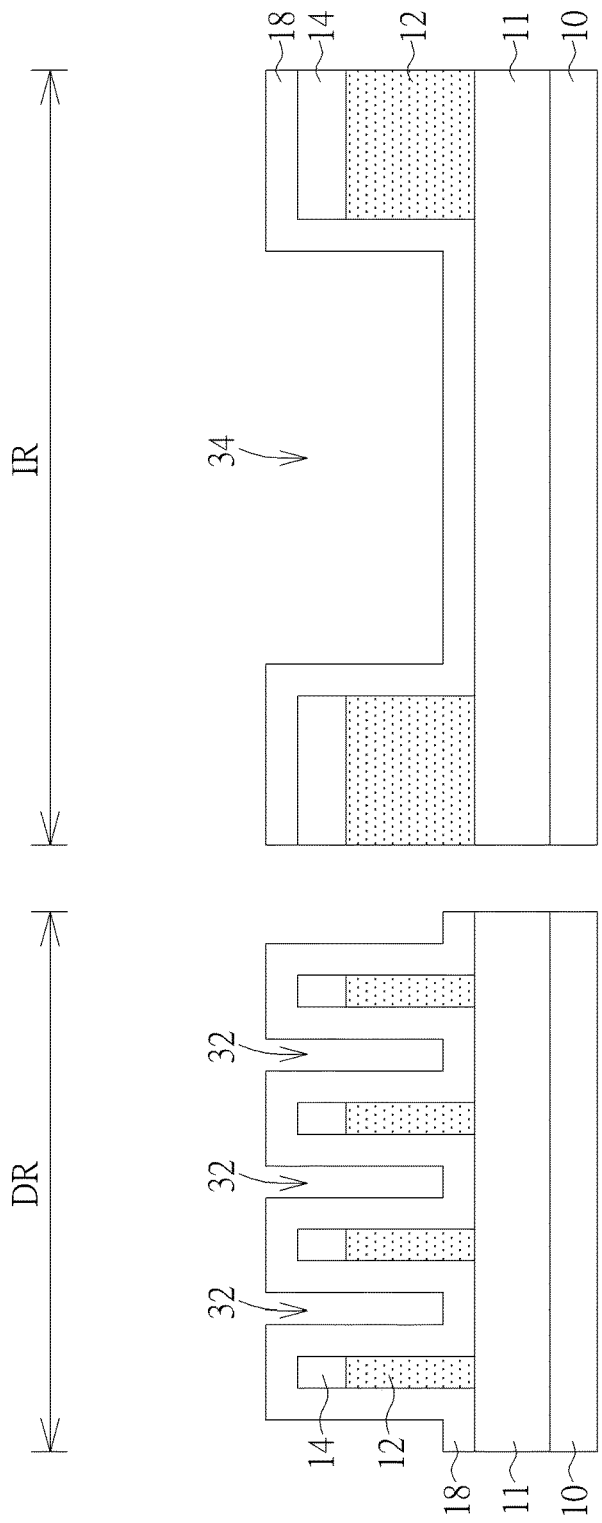

As shown in FIG. 3, an oxide layer 18 is formed in the first recesses 32 and in the second recess 34 within the dense region DR and the isolation region IR, the material layer 14 is completely covered by the oxide layer 18. In the present embodiment, the oxide layer 18 includes such as a silicon oxide layer, but is not limited thereto. It is noteworthy that the material of the oxide layer 18 is different from the material of the first dielectric layer 12, and the two materials have etching selectivity (that is, for a same etching process, the etching rate for etching the oxide layer 18 different from the etching rate for etching the first dielectric layer 12).

Figure 4:
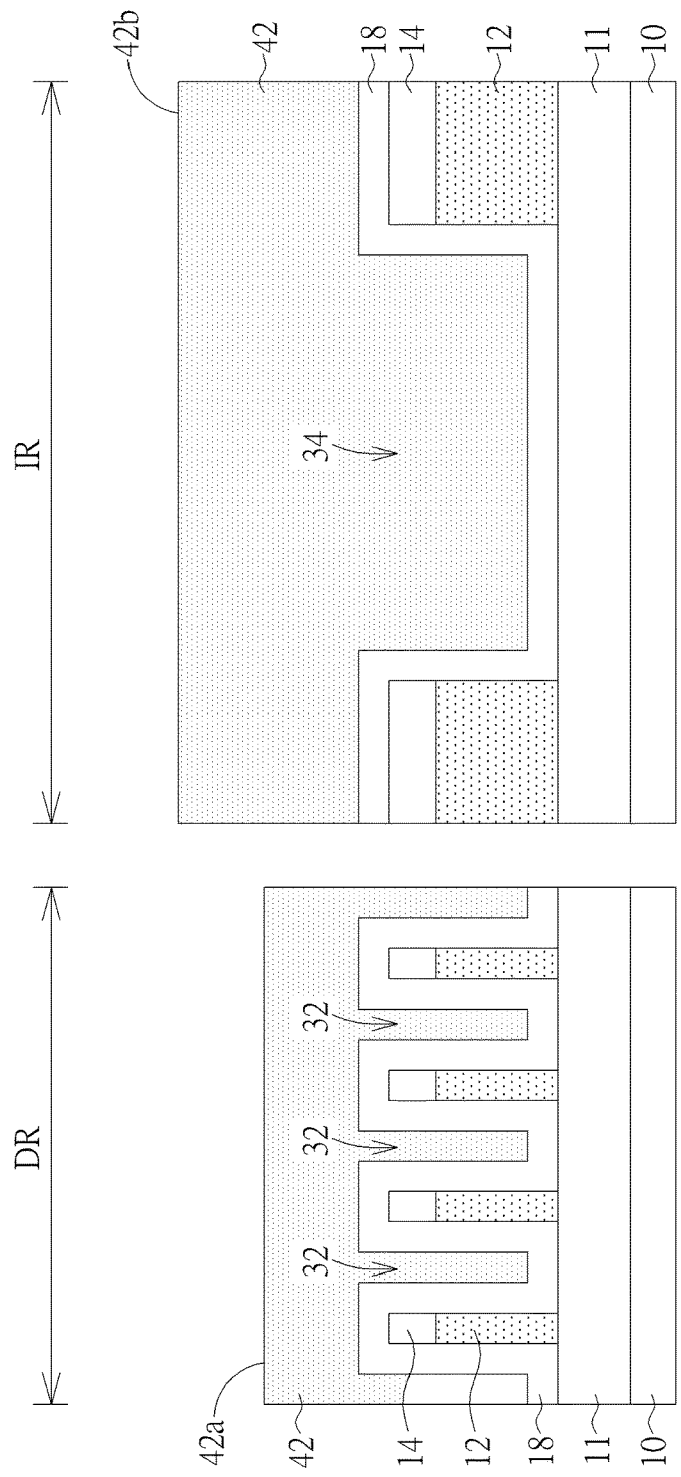

As shown in FIG. 4, a second dielectric layer 42 is formed to fill the first and second recesses 32 within the dense region DR and the second recess 34 within the isolation region IR. The second dielectric layer 42 is preferably has the same material as the material of first dielectric layer 12, for example, the second dielectric layer 42 may include organic dielectric layer (ODL). Therefore, the second dielectric layer 42 and the oxidizing material have different material, and there is an etching selectivity therebetween. It is noteworthy that after the second dielectric layer 42 is formed, a top surface 42a of the second dielectric layer 42 within the dense region DR will be lower than a top surface 42b of the second dielectric layer 42 within the isolation region IR. The reason is that there are many first recesses 32 formed in the dense region DR, and the extra second dielectric layer 42 is formed on the oxide layer 18 after the second dielectric layer 42 fills up the first recesses 32. On the other hand, the isolation region IR has a second recess 34 disposed therein, after the second dielectric layer 42 fills up the second recess 34, the extra second dielectric layer 42 will be formed on the oxide layer 18. However, since the number of the first recesses 32 is much larger than the number of the second recess 34, therefore, a large portion of the second dielectric layer 42 is filled into the first recesses 32 within the dense region DR, and the volume of the remaining dielectric layers 42 are relative small. On the other hand, within the isolation region IR, a smaller portion of the second dielectric layer 42 is filled into the second recess 34, and the volume of the remaining second dielectric layer 42 is larger, resulting in the top surface 42a of the second dielectric layer 42 within the dense region DR will be lower than the top surface 42b of the second dielectric layer 42 within the isolation region IR. In the present embodiment, for example, the vertical distance between the top surface 42a of the second dielectric layer 42 and the top surface of the first dielectric layer 12 within the dense region DR is between 600 and 900 angstroms, and the vertical distance between the top surface 42b of the second dielectric layer 42 and the top surface of the first dielectric layer 12 within the isolation region IR is between 1100 and 1500 angstroms, but is not limited thereto.

Figure 5:
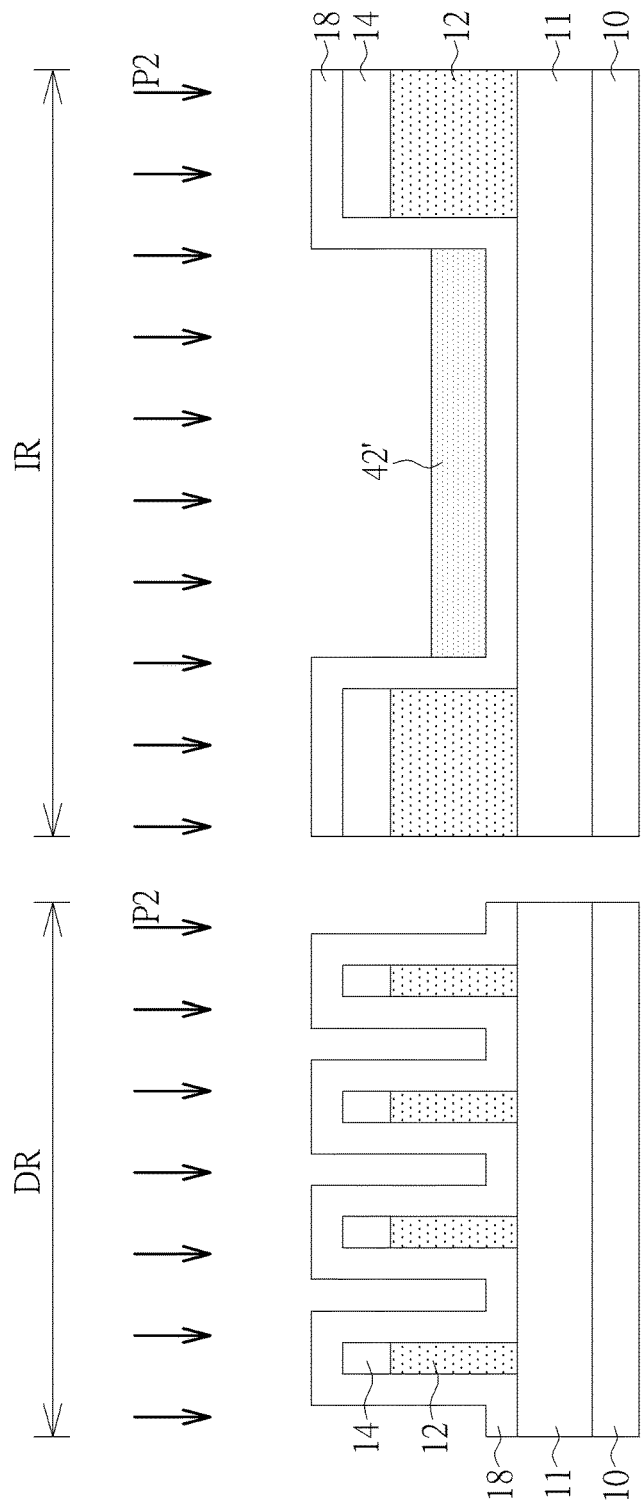

As shown in FIG. 5, an etching back process P2 is carried out to remove the second dielectric layer 42 within the dense region DR and the isolation region IR, until the second dielectric layer 42 within the dense region DR is completely removed. It is noteworthy that as mentioned above, since the top surface 42b of the second dielectric layer 42 is higher within the isolation region IR, when the second dielectric layer 42 within the dense region DR is completely removed, a portion of the second dielectric layer 42' within the isolation region IR still exists in the second recess 34.

Figure 6:
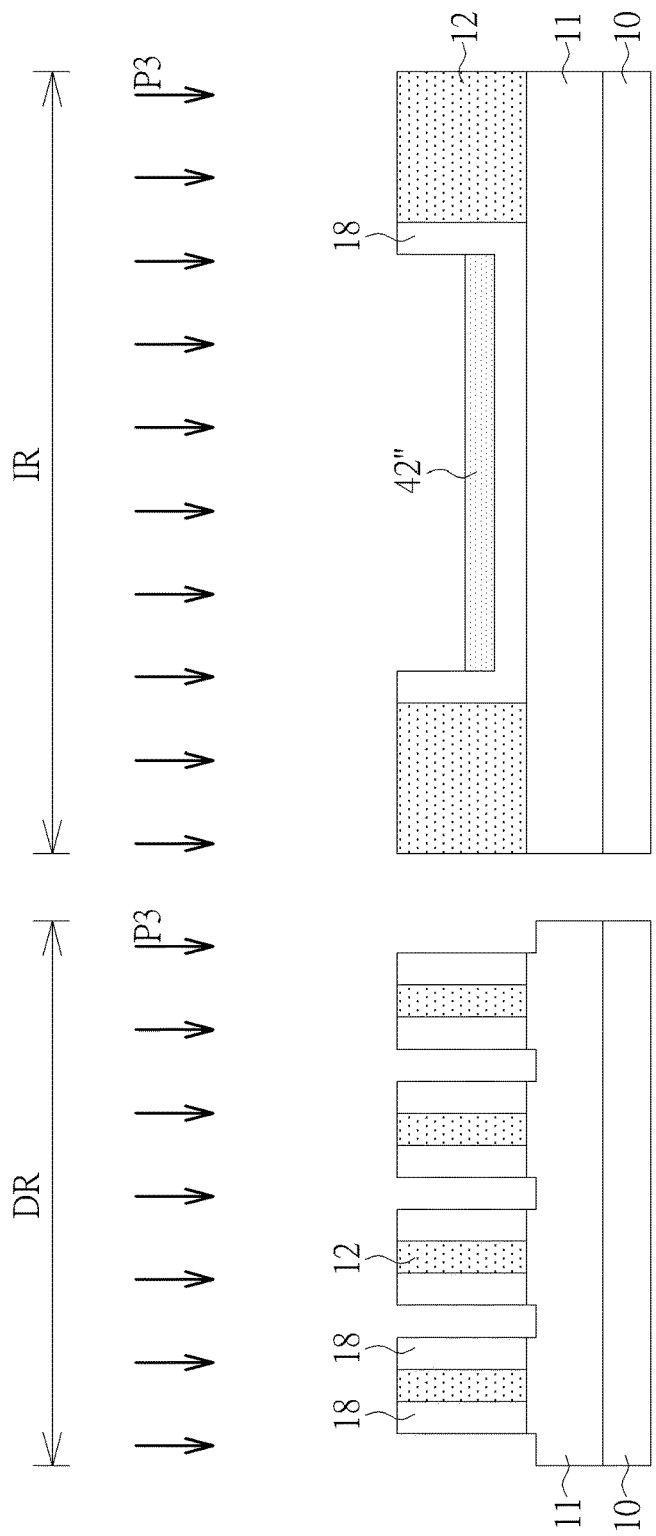

As shown in FIG. 6, an etching process P3 is performed, for example, an anisotropic etching in a vertical direction is performed to remove parts of the oxide layer 18 and the material layer 14, and the first dielectric layer 12 is exposed again. As described above, since the oxide layer 18 and the second dielectric layer 42 are different in material and have etching selectivity therebetween, the etching process P3 can effectively remove the oxide layer 18, but it is hardly to remove the first dielectric layer 12 and the second dielectric layer 42. After the etching process P3 is carried out, the remaining oxide layer 18 located within the dense region DR include a plurality of vertical structures, and the remaining oxide layer 18 within the isolation region IR has an U-shaped profile structure. In addition, a portion of the second dielectric layer 42" still remains in the second recess 34 within the isolation region IR.

Figure 7:
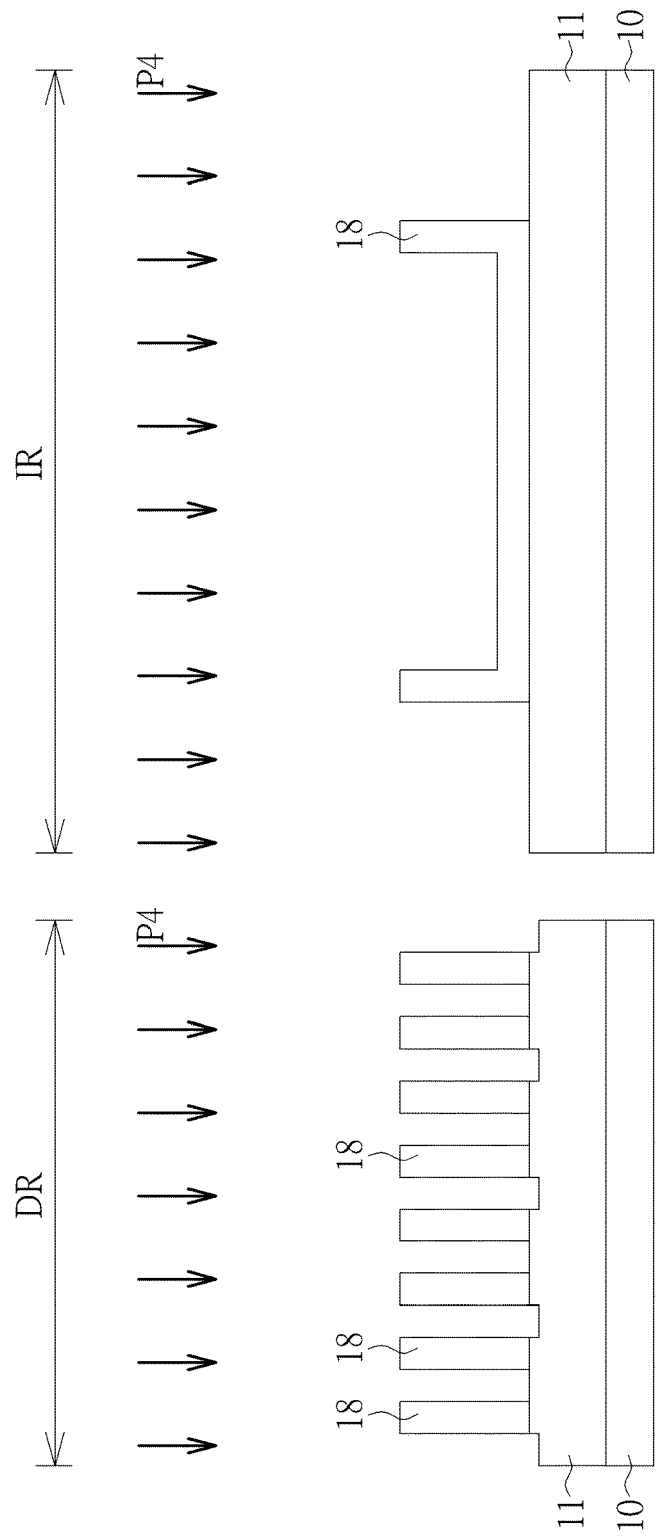
Figure 8:
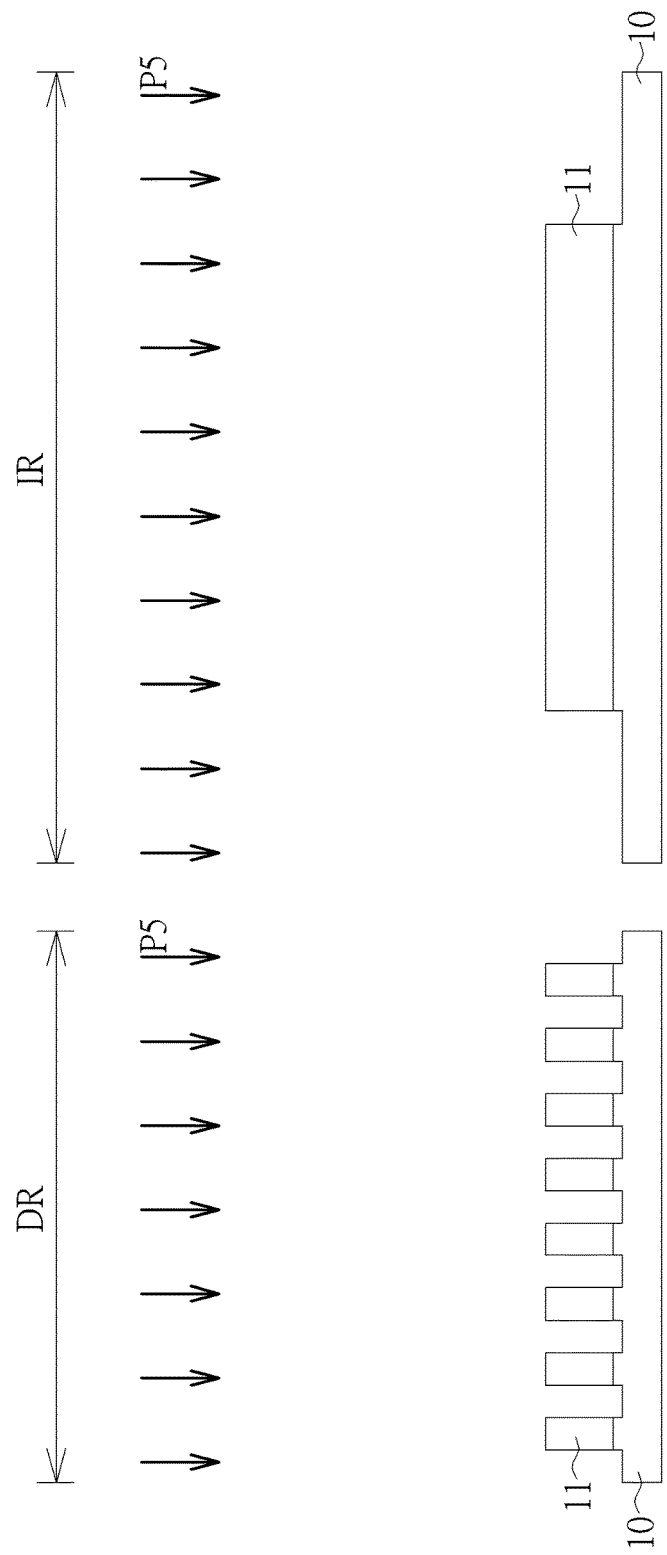

As shown in FIG. 7, an ashing process P4 is performed to completely remove the remaining first dielectric layer 12 and the second dielectric layer 42 within the dense region DR and the isolation region IR, after the ashing step P4 is performed, only the oxide layer 18 exists on the mask layer 11, other material layers such the second dielectric layer 42" is removed. Finally, as shown in FIG. 8, the remaining oxide layer 18 is used as the mask, an etching process P5 is performed, and the pattern of the oxide layer 18 is transferred into the mask layer 11, so as to define the needed patterns. Other steps may be performed in the following steps, for example, forming a plurality of transistors in the dense region DR, or forming a resistor structure or parts of agate structure in the isolation region IR. The processes are well known to the person skilled in the art, and are not described here.

The invention is characterized in that the patterns are respectively formed in the dense region and the isolation region by using a same mask, and using the difference of the element density between the dense region and the isolation region, to make the second dielectric layer within the dense region and within the isolation region have different top surface heights. Therefore, in the following etching processes, a portion of the second dielectric layer remains within the isolation region after the second dielectric layer within the dense region is completely removed. The pattern can be reserved within the isolation region when the self-aligned etching process is performed in the dense region. With the method provided by the invention, the number of times for using the photomask can be reduced, and the process efficiency can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   providing a substrate, a dense region and an isolation region are defined on the substrate;
   forming a first dielectric layer within the dense region and the isolation region;
   forming a plurality of first recesses in the first dielectric layer within the dense region, and forming a second recess in the first dielectric layer within the isolation region, wherein a width of the second recess is greater than three times of the width of each first recess;
   forming a second dielectric layer to fill up the first recesses and the second recess, wherein a top surface of the second dielectric layer within the isolation region is higher than a top surface of the second dielectric layer within the dense region; and
   performing an etching back process to remove the second dielectric layer within the dense region and within the isolation region.

2. The method of claim 1, wherein the etching back process completely removes the second dielectric layer within the dense region.

3. The method of claim 1, wherein a portion of the second dielectric layer within the isolation region is removed after the etching back process is performed.

4. The method of claim 1, further comprising forming an oxide layer in each first recess and in the second recess.

5. The method of claim 4, further comprising performing a second etching process to partially remove the oxide layer.

6. The method of claim 5, wherein a portion of the second dielectric layer is still located in the second recess within the isolation region after the second etching process is performed.

7. The method of claim 5, wherein after the second etching process is performed, the remaining oxide layer located within the dense region comprises a plurality of vertical structures, and the remaining oxide layer located within the isolation region comprises an U-shaped profile structure.

8. The method of claim 5, further comprising forming a silicon nitride layer between the substrate and the first dielectric layer.

9. The method of claim 8, further comprising performing a third etching process, using the remaining oxide layer as a mask to partially remove the silicon nitride layer.

10. The method of claim 8, wherein each first recess and second recess expose the silicon nitride layer.

11. The method of claim 1, wherein the first dielectric layer comprises an organic dielectric layer.

12. The method of claim 1, wherein the second dielectric layer comprises an organic dielectric layer.

13. The method of claim 1, wherein the second dielectric layer fills up the first recesses within the dense, a vertical height between the first dielectric layer and the second dielectric layer is between 600 angstroms to 900 angstroms.

14. The method of claim 1, wherein the second dielectric layer fills up the second recess within the isolation region, a vertical height between the first dielectric layer and the second dielectric layer is between 1100 angstroms to 1500 angstroms.

15. The method of claim 1, wherein each first recess has a first width, the second recess has a second width, and the second width is greater than five times than the first width.

16. The method of claim 1, further comprising forming a dielectric anti-reflective coating (DARC) on the first dielectric layer before the first recesses and the second recess are formed.

* * * * *